United States Patent
Li et al.

(10) Patent No.: US 7,385,287 B2
(45) Date of Patent: Jun. 10, 2008

(54) PREVENTING DAMAGE TO LOW-K MATERIALS DURING RESIST STRIPPING

(75) Inventors: Siyi Li, Fremont, CA (US); Helen H. Zhu, Fremont, CA (US); Howard Dang, Milpitas, CA (US); Thomas S. Choi, San Jose, CA (US); Peter Loewenhardt, Pleasanton, CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

(21) Appl. No.: 11/744,035

(22) Filed: May 3, 2007

(65) Prior Publication Data

US 2007/0287292 A1 Dec. 13, 2007

Related U.S. Application Data

(62) Division of application No. 10/866,382, filed on Jun. 10, 2004, now Pat. No. 7,226,852.

(51) Int. Cl.
*H01L 23/52* (2006.01)
*H01L 29/40* (2006.01)

(52) U.S. Cl. .............. 257/734; 257/768; 257/774; 257/E23.141; 257/E29.111; 257/741; 438/597

(58) Field of Classification Search .......... 257/768, 257/734, 741, 774, E23.141, E29.111
See application file for complete search history.

(56) References Cited

U.S. PATENT DOCUMENTS

| | | | |
|---|---|---|---|
| 6,413,877 B1 | 7/2002 | Annapragada | |
| 6,630,407 B2 | 10/2003 | Keil et al. | |
| 6,720,132 B2 | 4/2004 | Tsai et al. | |
| 6,914,004 B2 | 7/2005 | Thompson | |
| 7,023,093 B2 | 4/2006 | Canaperi et al. | |
| 7,081,407 B2 | 7/2006 | Annapragada | |
| 7,169,440 B2 * | 1/2007 | Balasubramaniam et al. | 427/162 |
| 7,226,852 B1 | 6/2007 | Li et al. | |
| 2002/0113037 A1 * | 8/2002 | Wu et al. | 216/67 |
| 2003/0064601 A1 * | 4/2003 | Thompson | 438/707 |
| 2004/0018715 A1 | 1/2004 | Sun et al. | |
| 2004/0192058 A1 | 9/2004 | Chu et al. | |
| 2006/0199370 A1 | 9/2006 | Dai et al. | |
| 2007/0241455 A1 * | 10/2007 | Wang et al. | 257/734 |

OTHER PUBLICATIONS

Office Action Dated Oct. 5, 2004 in related U.S. Patent 7,226,852 Issued Jun. 5, 2007.
Office Action Dated Mar. 28, 2005 in related U.S. Patent 7,226,852 Issued Jun. 5, 2007.

(Continued)

*Primary Examiner*—Michael S. Lebentritt
*Assistant Examiner*—Angel Roman
(74) *Attorney, Agent, or Firm*—Beyer Law Group LLP

(57) ABSTRACT

A method of forming a feature in a low-k dielectric layer is provided. A low-k dielectric layer is placed over a substrate. A patterned photoresist mask is placed over the low-k dielectric layer. At least one feature is etched into the low-k dielectric layer. A CO conditioning is preformed on the at least one feature after the at least one feature is etched. The patterned photoresist mask is stripped after the CO conditioning.

20 Claims, 5 Drawing Sheets

OTHER PUBLICATIONS

Office Action Dated Aug. 9, 2005 in related U.S. Patent 7,226,852 Issued Jun. 5, 2007.
Office Action Dated Jan. 26, 2006 in related U.S. Patent 7,226,852 Issued Jun. 5, 2007.
Office Action Dated May 5, 2006 in related U.S. Patent 7,226,852 Issued Jun. 5, 2007.
Office Action Dated Oct. 26, 2006 in related U.S. Patent 7,226,852 Issued Jun. 5, 2007.
Notice of Allowance Dated Feb. 5, 2007 in related U.S. Patent 7,226,852 Issed Jun. 5, 2004.
Supplemental Notice of Allowance Dated Mar. 19, 2007 in related U.S. Patent 7,226,852 Issued Jun. 5, 2004.

* cited by examiner

PREVENTING DAMAGE TO LOW-K MATERIALS DURING RESIST STRIPPING

CROSS-REFERENCE TO RELATED APPLICATIONS

This application is a divisional application and claims priority under 35 USC § 120 to U.S. application Ser. No. 10/866,382 filed Jun. 10, 2004 now U.S. Pat. No. 7,226,852 and is hereby incorporated by reference in its entirety for all purposes.

BACKGROUND OF THE INVENTION

The present invention relates to the fabrication of semiconductor-based devices. More particularly, the present invention relates to improved techniques for fabricating semiconductor-based devices with low-k dielectric layers.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias, and trenches may be etched into the dielectric material and filled with copper. The excess copper may be removed by chemical mechanical polishing (CMP) leaving copper lines connected by vias for signal transmission. To reduce the RC delays even further, porous and non-porous low-k dielectric constant materials may be used. In the specification and claims low-k is defined as k<3.0.

Porous and non-porous low dielectric constant materials may include organo-silicate-glass (OSG) materials. OSG materials may be silicon dioxide doped with organic components such as methyl groups. OSG materials have carbon and hydrogen atoms incorporated into a silicon dioxide lattice, which lowers the dielectric constant of the material. However OSG materials may be susceptible to damage when exposed to $O_2$, $H_2$, $N_2$, and $NH_3$ gases, which are used for stripping photo resist or fluorine within a stripping plasma.

Porous material has pores, which allow stripping plasmas to reach deeper into the layer causing greater damage. Porous OSG materials may be very susceptible to damage due to the removal of organic content by exposure to the plasma used to strip the resist and sidewalls. The plasma may diffuse into the pores of the porous OSG layer and cause damage as far as 300 nm into the OSG layer bordering the opening. Part of the damage caused by the plasma is the removal of carbon and hydrogen from the damage area causing the OSG to be more like silicon dioxide, which has a higher dielectric constant. Damage may be quantified by measuring the change in SiC/SiO ratio of the OSG layer from FTIR analysis. When translated to the trench side wall that means a damage of a few hundred angstroms on each side of a 2000 Å trench wall.

It is desirable to reduce damage to low-k dielectric layers during the stripping process.

SUMMARY OF THE INVENTION

To achieve the foregoing and other objects and in accordance with the purpose of the present invention a method of forming a feature in a low-k dielectric layer is provided. A low-k dielectric layer is placed over a substrate. A patterned photoresist mask is placed over the low-k dielectric layer. At least one feature is etched into the low-k dielectric layer. A CO conditioning is performed on the at least one feature after the at least one feature is etched. The patterned photoresist mask is stripped after the CO conditioning.

In another manifestation of the invention a method of forming a feature in a low-k dielectric layer is provided low-k dielectric layer over a substrate. A patterned photoresist mask is placed over the low-k dielectric layer. At least one feature is etched into the low-k dielectric layer. A defluorination process is performed on the at least one feature after the at least one feature is etched. The patterned photoresist mask is stripped after the defluorination process.

In another manifestation of the invention a method of forming a feature in a low-k dielectric layer is provided low-k dielectric layer over a substrate. A patterned photoresist mask is placed over the low-k dielectric layer. At least one feature is etched into the low-k dielectric layer. A sidewall outer layer densification process is performed on the at least one feature after the at least one feature is etched. The patterned photoresist mask is stripped after the densification process.

In another manifestation of the invention a method of stripping a photoresist mask over a low-k dielectric layer in which at least one feature has been etched is provided. A CO conditioning is performed on the at least one feature after the at least one feature is etched. The CO conditioning comprises providing a gas consisting essentially of CO and CO with an inert diluent and forming a plasma from the gas. The patterned photoresist mask is stripped after the CO conditioning.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
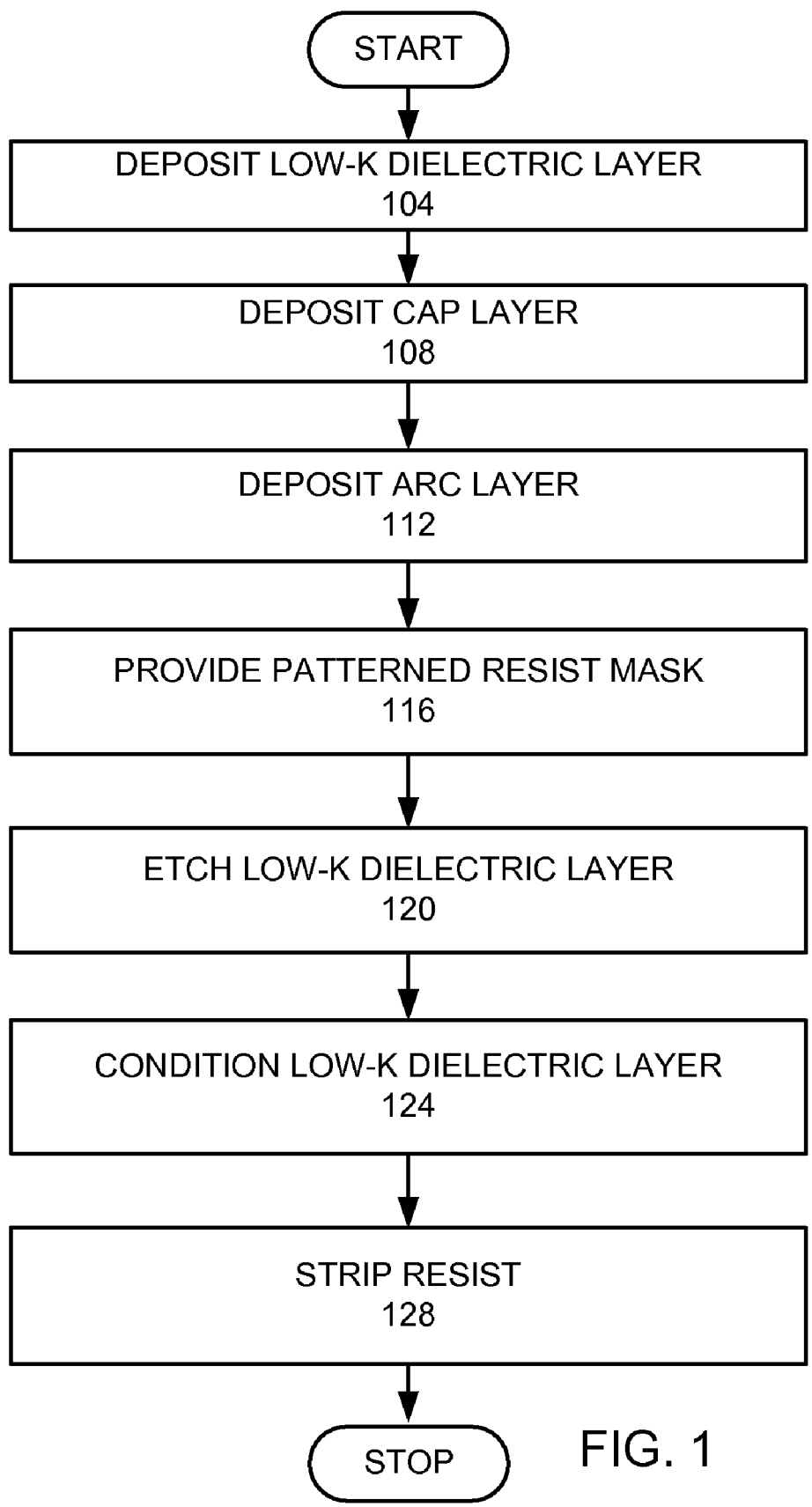
FIG. 1 is a flow chart of a process used in an embodiment of the invention.
Figure 2A:
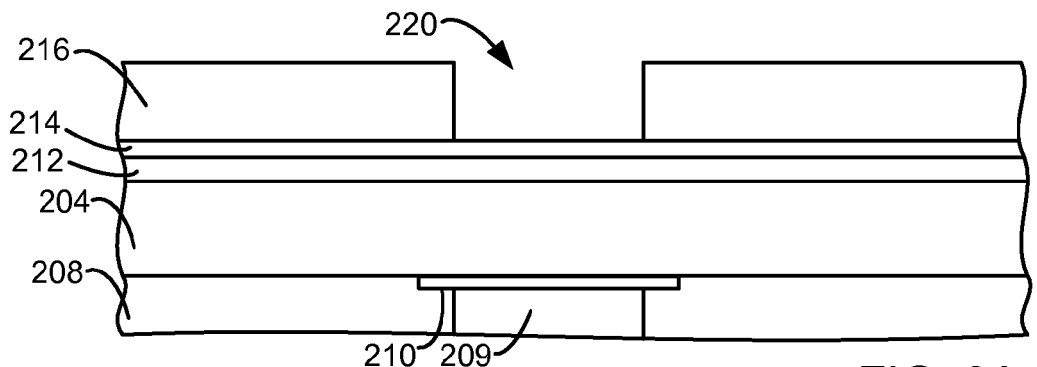
FIGS. 2A-F are schematic side views of an etched porous low-K dielectric layer according to the process of FIG. 1.
Figure 2B:
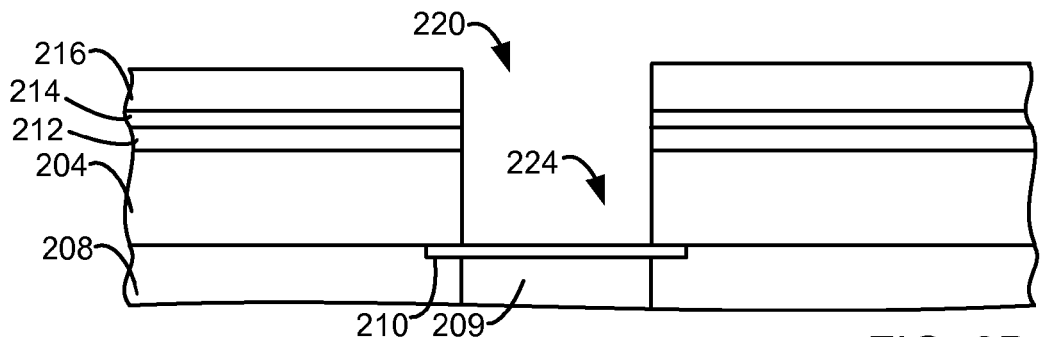
Figure 2C:
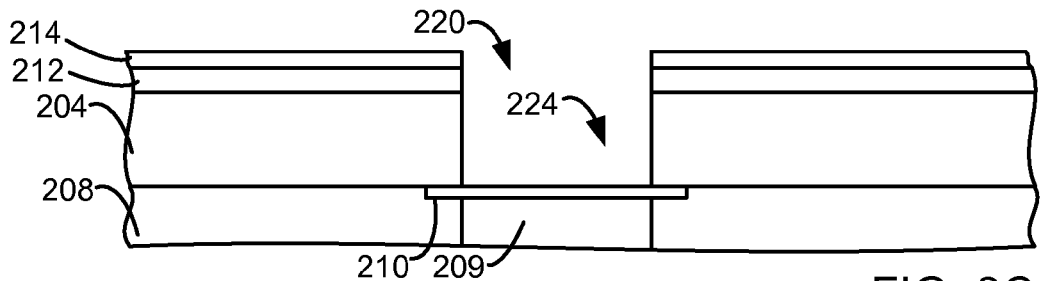
Figure 2D:
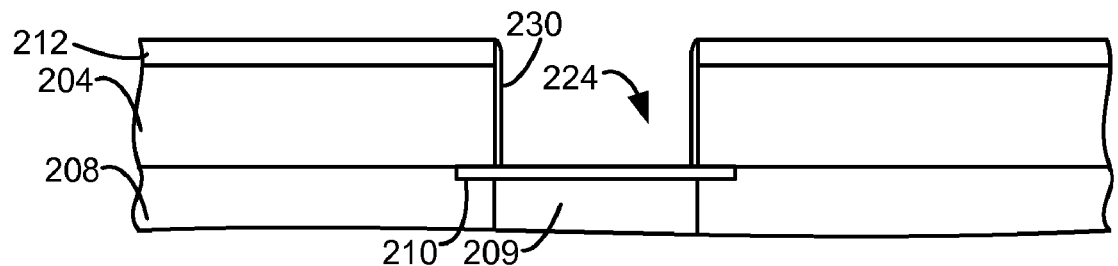
Figure 2E:
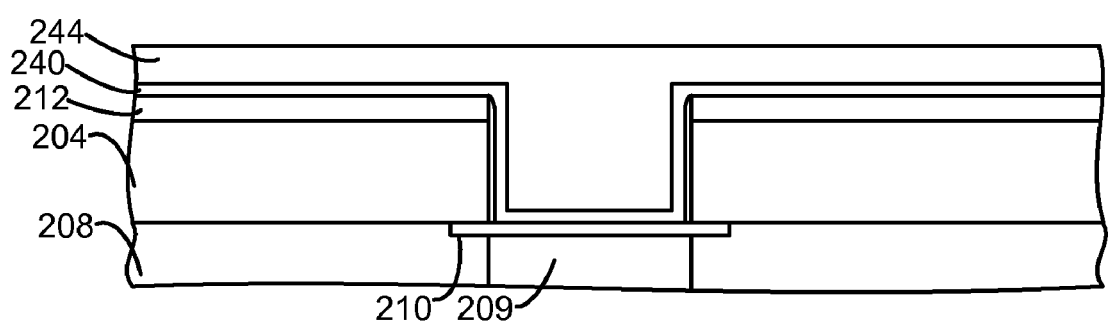
Figure 2F:
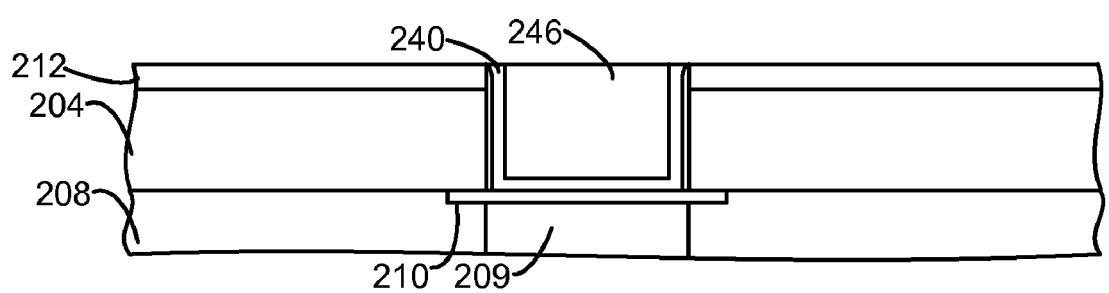

To facilitate discussion, FIG. 1 is a flow chart of an etching process of low-k dielectric layer used in an embodiment of the invention. Preferably, the low-k dielectric layer is an organosilicate glass (OSG). FIGS. 2A-C are schematic side views of a low-k dielectric layer according to the process of FIG. 1. A low-k dielectric layer 204 may be deposited on a substrate 208 (step 104), as shown in FIG. 2A. The substrate 208 may be a silicon wafer or another type of material or may be part of a layer over a wafer. A cap layer 212 is formed over the low-k dielectric layer 204 (step 108). The cap layer 212 may be silicon oxide. Generally, the cap layer is a protective layer of a dielectric material. The cap layer 212 protects the low-k dielectric layer 204 during chemical mechanical polishing (CMP) and other processes. The cap layer 212 may be a low-k dielectric, since the cap layer is part of the end product. Preferably, the cap layer is of a silicon oxide base material. The cap layer is preferably has a thickness of between about 200 Å and about 1000 Å. In other embodiments, there may be more than one cap layer or no cap layer. An antireflective coating (ARC) 214 is deposited over the cap layer 212 (step 112). The antireflective coating (ARC) 214 may be an organic bottom antireflective coating (BARC) or an inorganic dielectric antireflective coating (DARC). The ARC has a thickness between about 100 Å and about 1000 Å. A patterned resist mask 216 is provided over the ARC 214 (step 116). The patterned resist mask 216 has an aperture 220. The patterned resist mask may be formed by placing a layer of photoresist, which is exposed to a light pattern and then etched. Other methods of forming a patterned resist mask may be used. The substrate 208 may have a contact 209 and a barrier layer 210.

The substrate 208 may be placed in an etching chamber where the low-k dielectric layer 204 is etched (step 120). A plasma dry etch may be used to etch the low-k dielectric layer 204, which forms an opening 224 under the aperture 220 in the patterned resist mask 216, as shown in FIG. 2B. Some of the patterned resist mask 216 is removed during the low-k dielectric layer etch. Such low-k dielectric etches may use a chemical etch, such as using a fluorine based etchant. For example, an etch chemistry may use $CF_4/N_2$ or $C_4F_8/N_2$. As a result, the sidewalls of the feature may be etched. In addition, such etches may deposit polymer.

The low-k dielectric layer 204 is then conditioned to prevent damage during the stripping (step 124). In a preferred embodiment, the conditioning is provided by providing a conditioning gas of carbon monoxide CO, which is called pre-strip-conditioning (PSC). Without being bound by theory, it is believed that CO plasma scavenges fluorine deposited during the dielectric etch, providing a defluorination process, and/or modifies the outer layer of the sidewall to prevent the low-k dielectric layer 204 from being damaged, providing a densification process. It is believed that the removal of the fluorine reduces low-k damage during the strip step. It is believed that the densification process reduces low-k damage by sealing pores or forming a barrier layer.

The patterned resist mask 216 is stripped (step 128) after the conditioning step is completed, as shown in FIG. 2C. Typical photoresist strip chemistries use $O_2$, $NH_3$, $N_2$, or $H_2$ based stripping chemistries.

In some embodiments of the invention, the barrier layer 210 may be opened before or after the photoresist 216 is stripped.

Figure 3:
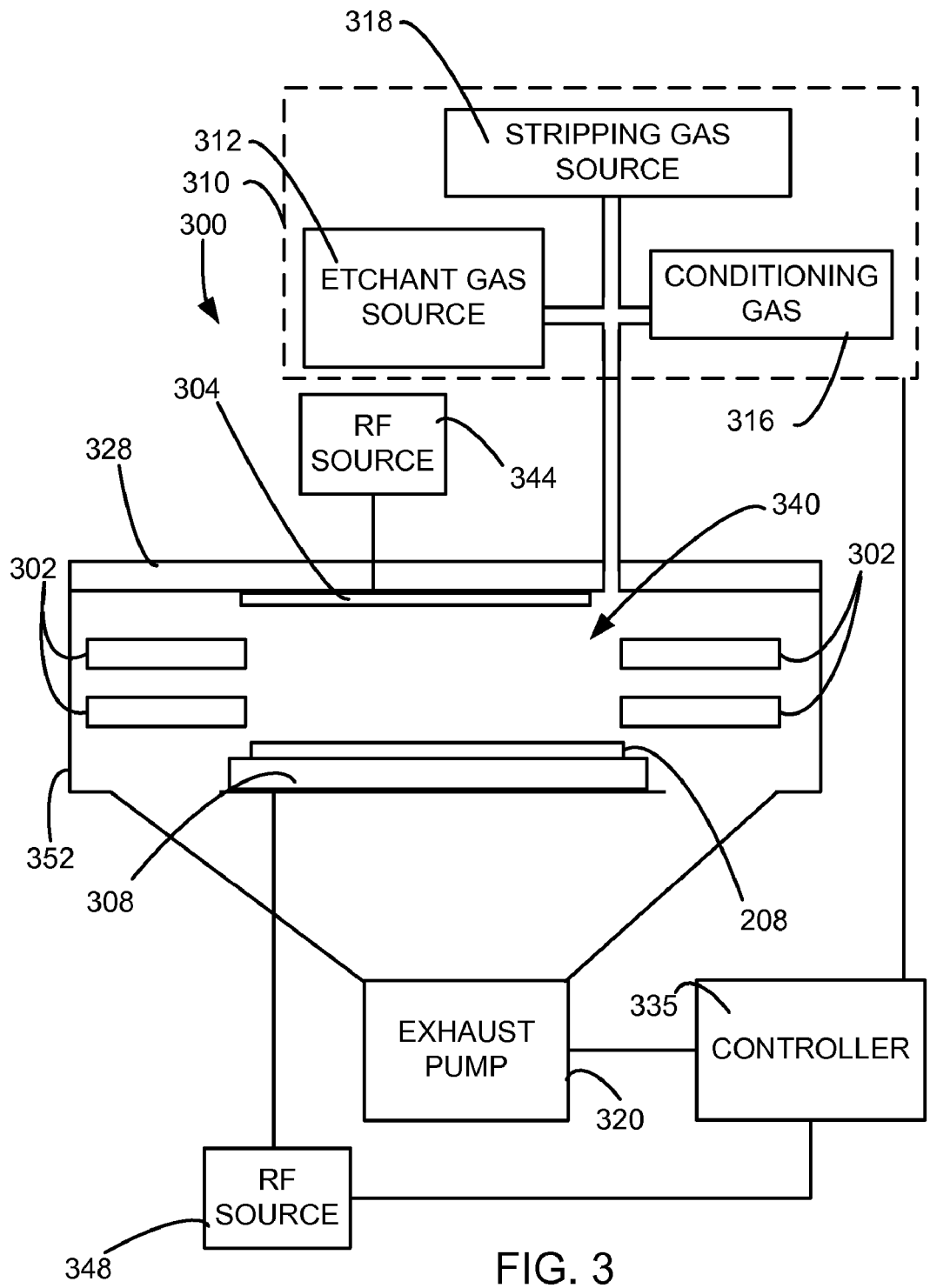
FIG. 3 is a schematic view of a process chamber that may be used in an embodiment of the invention.

FIG. 3 is a schematic view of a plasma processing chamber 300 that may be used for etching the feature, and then doing pre strip conditioning, and then stripping the photoresist in situ. The plasma processing chamber 300 comprises confinement rings 302, an upper electrode 304, a lower electrode 308, a gas source 310, and an exhaust pump 320. The gas source 310 comprises an etchant gas source 312, a conditioning gas source 316, and a stripping gas source 318. The gas source 310 may comprise additional gas sources. Within plasma processing chamber 300, the substrate 208 is positioned upon the lower electrode 308. The lower electrode 308 incorporates a suitable substrate chucking mechanism (e.g., electrostatic, mechanical clamping, or the like) for holding the substrate 208. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. A first RF source 344 is electrically connected to the upper electrode 304. A second RF source 348 is electrically connected to the lower electrode 308. Chamber walls 352 surround the confinement rings 302, the upper electrode 304, and the lower electrode 308. Both the first RF source 344 and the second RF source 348 may comprise a 27 MHz to 60 MHz power source and a 2 MHz power source. Different combinations of connecting RF power to the electrode are possible. An Exelan 2300™ or 2300 Flex™, which are made by LAM Research Corporation™ of Fremont, Calif., may be used in a preferred embodiment of the invention.

Figure 4A:
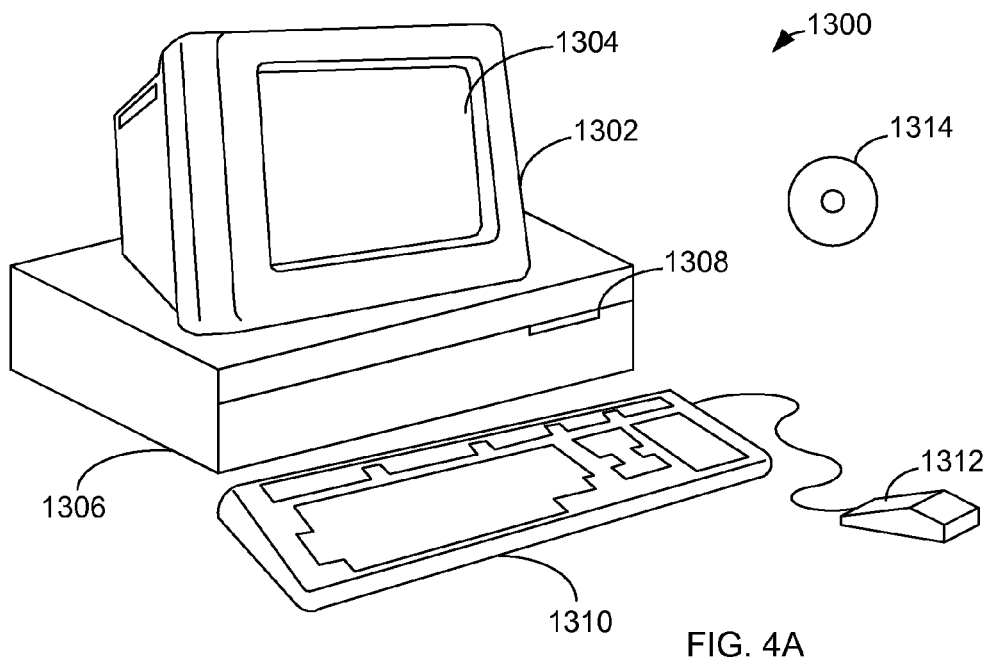
FIGS. 4A-B are schematic views of a computer system that may be used as a controller.
Figure 4B:
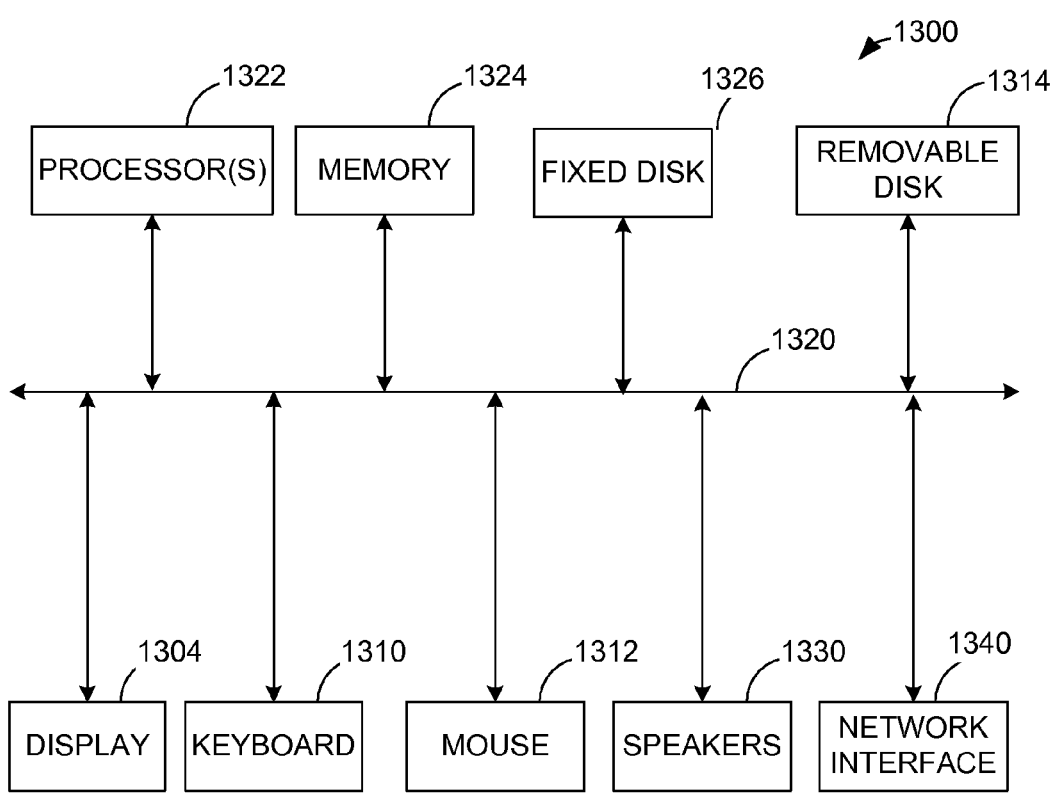

FIGS. 4A and 4B illustrate a computer system 1300, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

If the CO conditioning provides the removal of fluorine to prevent damage, other embodiments may use defluorination gases selected from the group of $CO_2$, CO, $H_2$, $NH_3$, and HCOH, where the conditioning is a defluorination step. During a defluorination step, a gas is provided consisting essentially of a defluorination gas and an inert diluent, or a defluorination gas only.

The etched feature may be a trench or a via, which may be part of a single etch process or a dual damascene process.

In embodiments of the invention, the low-k dielectric may be a porous low-k dielectric. In such embodiments, preferably the pores are nanometer sized pores. More preferably, the pores are from about 1 nm to about 10 nm. In the definition and claims, the phrase porous low-k dielectric is a dielectric with a dielectric constant of less than 2.3, since dielectric materials with a dielectric constant of less than 2.3 are usually porous. An example of porous low-k dielectric materials is JSR LKD-5109 Low-k dielectric, made by JSR Corporation of Tokyo, Japan and Zirkon™ LK made by Shipley Microelectronics, which is a subsidiary of Rohm and Haas of Philadelphia, Pa.

The inventive conditioning step preferably does not etch the dielectric layer.

EXAMPLE

In an example of the invention, a low-k dielectric layer of OSG was placed over a substrate. A silicon oxide cap layer was deposited over the low-k dielectric layer. The cap layer is about 500 Å thick. An organic ARC layer was formed over the cap layer. A patterned photoresist mask was formed over the ARC. In this example, the photoresist (PR) was 193 nm PR.

The substrate was then placed in an Exelan 2300 dielectric etcher. A feature was etched through the ARC layer and the low-k OSG layer. An example of an etch process would be a conventional etch, which is preferably a fluorine etch, to etch through the low-k OSG layer.

After the feature was completely etched, the wafer was conditioned with a pre-strip CO conditioning step. This was done in situ. A CO conditioning gas chemistry of 200 sccm of CO was used to perform the CO conditioning. The chamber pressure was set to about 10 mTorr. 600 W was provided by the 27 MHz RF source. No power was provided by the 2 MHz RF source. The CO conditioning lasted for 30 seconds. Other pre-strip-conditioning process may provide from 50-500 sccm CO, with 100-1000 Watts of RF power at a frequency between 27 MHz to about 60 MHz, and with 0-300 Watts of RF power at about 2 MHz.

After the CO conditioning, the photoresist mask was stripped. This was done in situ. A stripping gas chemistry of 150 sccm of $O_2$ and 50 sccm of CO was used to strip the photoresist mask. The chamber pressure was set to about 10 mTorr. 300 W was provided by the 27 MHz RF source. 100 W was provided by the 2 MHz RF source. The stripping was provided for 38 seconds.

In experiments using the above example, it was found that CO conditioning unexpectedly reduced damage to the low-k dielectric that would be caused during the stripping process. This reduction in damage decreased the change in the k value.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications and various substitute equivalents as fall within the true spirit and scope of the present invention.

What is claimed is:

1. A semiconductor device with at least one feature formed by a method of forming a feature in a low-k dielectric layer, the method comprising:

placing a low-k dielectric layer over a substrate;

placing a patterned photoresist mask over the low-k dielectric layer;

etching at least one feature into the low-k dielectric layer, through at least one aperture in the patterned photoresist mask, to expose a substrate top surface;

performing a CO conditioning on the at least one feature after the at least one feature is etched; and stripping the patterned photoresist mask after the CO conditioning wherein the CO conditioning reduces damage to the low-k dielectric layer during the stripping.

2. The semiconductor device, as recited in claim 1, wherein the CO conditioning comprises:

providing a gas consisting essentially of a gas from the group of CO and CO with an inert diluent; and forming a plasma from the gas.

3. The semiconductor device, as recited in claim 2, wherein the etching the at least one feature, comprises providing a fluorine containing etchant gas.

4. The semiconductor device, as recited in claim 3, wherein plasma formed from the CO gas scavenges fluorine.

5. The semiconductor device, as recited in claim 4, wherein the low-k dielectric layer comprises organosilicate glass.

6. The semiconductor device, as recited in claim 5, wherein the method further comprises placing at least one cap layer over the low-k dielectric layer before placing the photoresist mask, wherein the photoresist mask is placed over the cap layer.

7. The semiconductor device, as recited in claim 1, wherein the etching the at least one feature, comprises providing a fluorine containing etchant gas.

8. A semiconductor device with at least one feature formed by a method of forming a feature in a low-k dielectric layer, the method comprising:
   placing a low-k dielectric layer over a substrate;
   placing a patterned photoresist mask with at least one aperture over the low-k dielectric layer;
   etching at least one feature into the low-k dielectric layer, through the at least one aperture in the patterned photoresist mask, to expose a substrate top surface;
   performing a defluorination process on the at least one feature after the at least one feature is etched; and
   stripping the patterned photoresist mask after the defluorination process, wherein the defluorination process reduces damage during the stripping the patterned photoresist mask.

9. The semiconductor device, as recited in claim 8, wherein the defluorination process comprises:
   providing a gas consisting essentially of at least one of $CO_2$, CO, $H_2$, $NH_3$, and HCOH and an inert diluent with at least one of $CO_2$, CO, $H_2$, $NH_3$, and HCOH; and
   forming a plasma from the gas.

10. The semiconductor device, as recited in claim 9, wherein the etching the at least one feature, comprises providing a fluorine containing etchant gas.

11. The semiconductor device, as recited in claim 10, wherein plasma formed during the defluorination process scavenges fluorine.

12. The semiconductor device, as recited in claim 11, wherein the low-k dielectric layer comprises organosilicate glass.

13. The semiconductor device, as recited in claim 12, wherein the method further comprises placing at least one cap layer over the low-k dielectric layer before placing the photoresist mask, wherein the photoresist mask is placed over the cap layer.

14. The semiconductor device, as recited in claim 8, wherein the etching the at least one feature, comprises providing a fluorine containing etchant gas.

15. The semiconductor device, as recited in claim 8, wherein plasma formed during the defluorination process scavenges fluorine.

16. A semiconductor device with at least one feature formed by a method of forming a feature in a low-k dielectric layer, comprising:
   placing a low-k dielectric layer over a substrate;
   placing a patterned photoresist mask over the low-k dielectric layer;
   etching at least one feature into the low-k dielectric layer, to expose a substrate top surface;
   performing a sidewall outer layer densification process on the at least one feature after the at least one feature is etched, wherein the sidewall outer layer densification process includes:
      providing a gas consisting essentially of at least one of $CO_2$, CO, $H_2$, $NH_3$, and HCOH and an inert diluent with at least one of $CO_2$, CO, $H_2$, $NH_3$, and HCOH; and
      forming a plasma from the gas; and
   stripping the patterned photoresist mask after the densification process, wherein the densification process reduces damage during the stripping.

17. The semiconductor device, as recited in claim 16, wherein the low-k dielectric layer comprises organosilicate glass.

18. A semiconductor device with at least one feature formed by a method of stripping a photoresist mask over a low-k dielectric layer, comprising:
   forming a patterned photoresist mask over the low-k dielectric layer;
   etching at least one feature through the patterned photoresist mask, to expose a substrate top surface;
   performing a CO conditioning on the at least one feature after the at least one feature is etched, comprising
      providing a gas consisting essentially of a gas from the group of CO and CO with an inert diluent; and
      forming a plasma from the gas; and
   stripping the patterned photoresist mask after the CO conditioning, wherein the CO conditioning reduces damage during the stripping.

19. The semiconductor device, as recited in claim 18, wherein the CO conditioning on the at least one feature conditions the low-k dielectric layer.

20. The semiconductor device, as recited in claim 18, wherein the CO conditioning on the at least one feature modifies a sidewall of the low-k dielectric layer in the at least one feature to prevent the low-k dielectric layer from being damaged.

* * * * *